US009431264B2

(12) United States Patent
Jang et al.

(10) Patent No.: US 9,431,264 B2
(45) Date of Patent: Aug. 30, 2016

(54) METHODS OF FORMING INTEGRATED CIRCUITS AND MULTIPLE CRITICAL DIMENSION SELF-ALIGNED DOUBLE PATTERNING PROCESSES

(71) Applicant: GLOBALFOUNDRIES, Inc., Grand Cayman (KY)

(72) Inventors: Linus Jang, Clifton Park, NY (US); Young Joon Moon, Clifton Park, NY (US); Ryan Ryoung Han Kim, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 54 days.

(21) Appl. No.: 14/014,906

(22) Filed: Aug. 30, 2013

(65) Prior Publication Data

US 2015/0064912 A1    Mar. 5, 2015

(51) Int. Cl.
   *H01L 21/308*   (2006.01)
   *H01L 21/033*   (2006.01)
   *H01L 21/8234*  (2006.01)
   *H01L 21/311*   (2006.01)
   *H01L 21/3213*  (2006.01)
   *H01L 21/28*    (2006.01)

(52) U.S. Cl.
   CPC ....... *H01L 21/3086* (2013.01); *H01L 21/0337* (2013.01); *H01L 21/28132* (2013.01); *H01L 21/31144* (2013.01); *H01L 21/32139* (2013.01); *H01L 21/823437* (2013.01); *H01L 21/823456* (2013.01)

(58) Field of Classification Search
   CPC ............................ H01L 21/311; H01L 21/308
   USPC ................................................. 438/702, 696
   See application file for complete search history.

(56) References Cited

U.S. PATENT DOCUMENTS

| | | | |
|---|---|---|---|
| 2006/0068596 A1* | 3/2006 | Dobuzinsky et al. | 438/740 |
| 2007/0249170 A1* | 10/2007 | Kewley | 438/706 |
| 2012/0043646 A1* | 2/2012 | Kim | 257/618 |
| 2012/0244711 A1* | 9/2012 | Yin et al. | 438/703 |

OTHER PUBLICATIONS

U.S. Appl. No. 13/874,577, filed May 1, 2013.

* cited by examiner

*Primary Examiner* — Asok K Sarkar
*Assistant Examiner* — Dmitriy Yemelyanov
(74) *Attorney, Agent, or Firm* — Ingrassia Fisher & Lorenz, P.C.

(57) ABSTRACT

Methods of forming integrated circuits and multiple CD SADP processes are provided that include providing a patternable structure including a first hard mask layer and a first patternable layer underlying the first hard mask layer. Mandrels are provided over the first hard mask layer. Sidewall spacers are formed adjacent sidewalls of the mandrels. The mandrels are removed, with the sidewall spacers remaining and defining gaps therebetween. The first hard mask layer is etched through the gaps to form a first patterned hard mask feature and a second patterned hard mask feature. A critical dimension of the first patterned hard mask feature is selectively modified to form a biased hard mask feature. A space is defined between sidewalls of the biased hard mask feature and the second patterned hard mask feature. The first patternable layer is etched through exposed material in the space.

19 Claims, 7 Drawing Sheets

METHODS OF FORMING INTEGRATED CIRCUITS AND MULTIPLE CRITICAL DIMENSION SELF-ALIGNED DOUBLE PATTERNING PROCESSES

TECHNICAL FIELD

The technical field generally relates to methods of forming integrated circuits and multiple critical dimension (CD) self-aligned double patterning (SADP) processes, and more particularly relates to multiple CD SADP processes for patterning nanometer-scale features in integrated circuits.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel and that is separated from the channel by a gate dielectric structure. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

As advanced metal-oxide-semiconductor (MOS) technology continues to scale and move into the deep-sub-micron geometry dimensions, advancements to techniques for further decreasing critical dimension (CD) of features have been sought. Self-aligned double patterning (SADP) is one technique that is used to pattern sub-resolution features in integrated circuits and often results in less line width roughness and enhanced control of CDs as compared to conventional lithography/etching techniques. During SADP, spacers are generally formed over an underlying substrate by first patterning mandrels over the underlying substrate. Spacer material is deposited over the mandrels and the underlying substrate and the spacer material is etched from horizontal surfaces to leave spacers adjacent to sidewalls of the mandrels. The mandrels are then removed, followed by etching through gaps between the spacers into the underlying substrate to thereby transfer a pattern into the underlying substrate. Features of the spacers define the pattern that is ultimately transferred into the underlying substrate, and sub-resolution pitch of the spacers can be achieved that is not possible through patterning of the mandrels with conventional lithography/etching techniques. The patterned underlying substrate may be employed for further patterning, or may be included in a final integrated circuit. For example, SADP may be employed for gate-level patterning, fin level patterning in FinFETs, or other patterning stages during both front-end-of-line (FEOL) and back-end-of line (BEOL) processing.

Conventional SADP generally only provides a nominal CD due to the uniform formation of the spacers, with all spacers formed through SADP generally having the same thickness. To provide spacers having different thicknesses, which may be desired to fabricate multi-gate length configurations, i.e., configurations that include nominal and biased gate lengths, in integrated circuits, additional masks can be selectively used to isolate spacers that are to be modified for purposes of defining different gate lengths, also known as gate length biasing. Gate length biasing enables current leakage between gates to be minimized, thereby minimizing power consumption of the integrated circuit although device performance/speed is sacrificed. In accordance with such techniques, a separate mask is required for each additional gate length. Modification of the spacers can be conducted through additive techniques, by which additional material is formed over the spacers to increase a width thereof, or by subtractive techniques, by which spacer material is removed (such as through etching) to decrease the width thereof. The additive and subtractive techniques may be conducted either before or after the mandrels are removed. However, additive and subtractive techniques for spacer modification present various problems. For example, subtractive techniques cannot be reliably implemented on a commercial scale because blind etching of the spacers is generally unpredictable, especially when the spacers are to be thinned by less than about 5 nm. Further, CD uniformity (CDU) is a challenge using the subtractive techniques. Regarding additive techniques and depending on different approaches, either variable mandrel CD and pitch is required (which is a challenge for both OPC and mask manufacturing) or multiple additional processing stages are required, thereby increasing processing cost.

Accordingly, it is desirable to provide methods of forming integrated circuits and multiple CD SADP processes that can be reliability implemented on a commercial scale with maximized CDU, especially when modification of the spacer CDs is on a small scale. Furthermore, other desirable features and characteristics of the present invention will become apparent from the subsequent detailed description of the invention and the appended claims, taken in conjunction with the accompanying drawings and this background of the invention.

BRIEF SUMMARY

Methods of forming integrated circuits and multiple critical dimension self-aligned double patterning processes are provided herein. In an embodiment, a method of forming an integrated circuit includes providing a patternable structure that includes a first hard mask layer and a first patternable layer. The first patternable layer underlies the first hard mask layer. Mandrels are provided over the first hard mask layer. Sidewall spacers are formed adjacent sidewalls of the mandrels. The mandrels are removed, with the sidewall spacers remaining and defining gaps therebetween. The first hard mask layer is etched through the gaps between the sidewall spacers to form a first patterned hard mask feature and a second patterned hard mask feature. A critical dimension of the first patterned hard mask feature is selectively modified relative to the second patterned hard mask feature to form a biased hard mask feature. A space is defined between sidewalls of the biased hard mask feature and the second patterned hard mask feature. The first patternable layer is etched through exposed material in the space defined between the sidewalls of the biased hard mask feature and the second patterned hard mask feature.

In another embodiment, a multiple critical dimension self-aligned double patterning process includes providing a patternable structure that includes a first hard mask layer, a first patternable layer, and an etch stop layer disposed between the first hard mask layer and the first patternable layer. The first patternable layer underlies the first hard mask layer. Mandrels are provided over the first hard mask layer. Sidewall spacers are formed adjacent sidewalls of the mandrels. The mandrels are removed, with the sidewall spacers remaining and defining gaps therebetween. The first hard mask layer is etched through the gaps between the sidewall spacers to the etch stop layer with etching terminated at the etch stop layer to form a first patterned hard mask feature and a second patterned hard mask feature. A critical dimension of the first patterned hard mask feature is selectively modified relative to the second patterned hard mask feature to form a biased hard mask feature. A space is defined between sidewalls of the biased hard mask feature and the second patterned hard mask feature. The first patternable layer is etched through exposed material in the space defined between the sidewalls of the biased hard mask feature and the second patterned hard mask feature.

In another embodiment, a method of forming an integrated circuit includes providing a patternable structure that includes a first hard mask layer that includes amorphous semiconductor material, a first patternable layer that underlies the first hard mask layer, and an etch stop layer that is disposed between the first hard mask layer and the first patternable layer. Mandrels are provided over the first hard mask layer. Sidewall spacers are formed adjacent sidewalls of the mandrels. The mandrels are removed, with the sidewall spacers remaining are removing the mandrels and with the sidewall spacers defining gaps therebetween. The first hard mask layer is etched through the gaps between the sidewall spacers to the etch stop layer, with etching terminated at the etch stop layer to form a first patterned hard mask feature and a second patterned hard mask feature. An overlying layer is formed over sidewalls of the first patterned hard mask feature, and the overlying layer includes an oxide overlying layer material. Sidewalls of the second patterned hard mask feature are free of the overlying layer. A space is defined between the overlying layer over the sidewall of the first patterned hard mask feature and the second patterned hard mask feature. The first patternable layer is etched through exposed material in the space defined between the overlying layer over the sidewall of the first patterned hard mask feature and the second patterned hard mask feature.

BRIEF DESCRIPTION OF THE DRAWINGS

The various embodiments will hereinafter be described in conjunction with the following drawing figures, wherein like numerals denote like elements, and wherein:

FIGS. 1-11B are cross-sectional side views illustrating a method of forming an integrated circuit and a multiple critical dimension self-aligned double patterning process in accordance with an exemplary embodiment.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Methods of forming integrated circuits and multiple critical dimension (CD) self-aligned double patterning (SADP) processes are provided herein. "Critical dimension", as used to herein, refers to the smallest feature size that is controlled through patterning, such as thickness of patterned lines. The multiple CD SADP processes enable patterning of features that have different CDs in integrated circuits, even when variation of the CDs is on a small scale such as on the order of nanometers, in a manner that can be reliability implemented on a commercial scale with maximized CD uniformity. In particular, in accordance with the methods described herein, sidewall spacers are formed adjacent to sidewalls of mandrels, over a first hard mask layer and a first patternable layer that underlies the first hard mask layer. The mandrels are removed, followed by etching the first hard mask layer through gaps between the sidewall spacers to form patterned hard mask features. CDs of the patterned hard mask features are modified, as opposed to modification of the sidewall spacers, to provide for the multiple CD aspect of the SADP processes described herein. The patterned hard mask features may exhibit greater CD uniformity than the sidewall spacers, and the patterned hard mask features may be formed in a manner that maximizes trench depth uniformity between the patterned hard mask features. As a result, modification of the patterned hard mask features may be controlled with greater accuracy and precision than modification of the sidewall spacers, enabling reliable CD modification on a commercial scale. The multiple CD SADP processes may be employed at various stages during integrated circuit fabrication including, but not limited to, gate level patterning and patterning of fins during fin field effect transistor (FET) fabrication, as well as other patterning stages during front-end-of-line (FEOL) or back-end-of-line (BEOL) processing.

Figure 1:
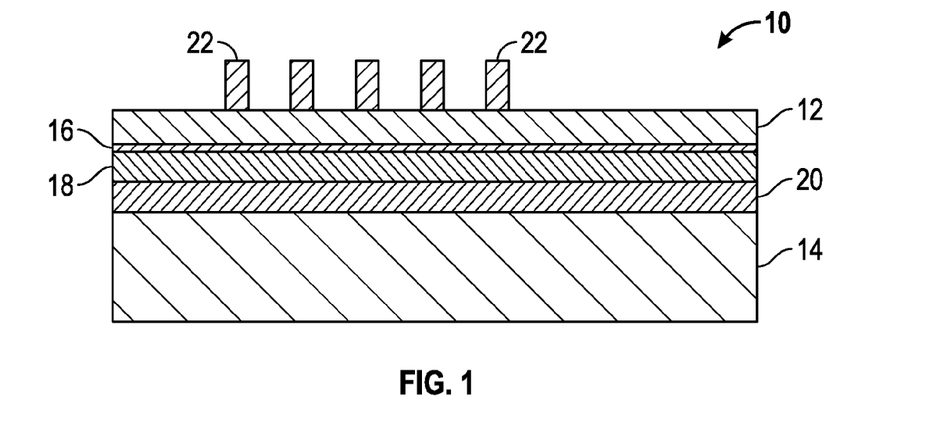

An exemplary embodiment of a method of forming an integrated circuit, which includes a multiple CD self-aligned double patterning process, will now be described with reference to FIGS. 1-11. Referring to FIG. 1, a patternable structure 10 is provided that includes at least a first hard mask layer 12 and a first patternable layer 14 that underlies the first hard mask layer 12. The patternable structure 10, as referred to herein, is a structure that includes the layers specified above and that is to be patterned through a SADP process as described herein. The first hard mask layer 12 is provided for receiving a pattern and for enabling the pattern to be transferred into the first patternable layer 14, with the first patternable layer 14 after patterning ultimately remaining in the integrated circuits that are formed in accordance with the methods described herein. Materials for the first hard mask layer 12 and the first patternable layer 14 are not particularly limited, but may be chosen based upon particular features to be patterned and etch selectivity with regard to other layers that are described in further detail below. In an embodiment, the first hard mask layer 12 includes an amorphous semiconductor material such as amorphous silicon, which may exhibit etch selectivity in various etchants, such as a mixture of nitric acid and HF, as compared to other layers that may be present in the patternable structure 10. Examples of materials for the first patternable layer 14 include, but are not limited to, semiconductor material or dielectric material, depending upon the features that are to be formed through patterning (e.g., BEOL features, fins, gate electrode structures or other FEOL structures, etc.).

The patternable structure 10 may include one or more additional layers, beyond the first hard mask layer 12 and the first patternable layer 14, for purposes as described in further detail below. For example, in an embodiment and as shown in FIG. 1, the patternable structure 10 further includes an etch stop layer 16 that is disposed between the first hard mask layer 12 and the first patternable layer 14. The etch stop layer 16 has a different etch rate in etchants that are effective to etch the first hard mask layer 12, i.e., etchants effective to etch the first hard mask layer 12 are selective to the first hard mask layer 12 over the etch stop layer 16, to thereby effectively terminate etching of the first hard mask layer 12 at the etch stop layer 16, as described below. For example, in an embodiment, the etch stop layer 16 may include a nitride such as silicon nitride. Additionally and as also shown in FIG. 1, the patternable structure 10 may further include at least a second hard mask layer 18 that is disposed between the etch stop layer 16 and the first patternable layer 14, which may assist with transferring a multiple CD configuration into the first patternable layer 14 and which may further serve to selectively protect an upper surface of the first patternable layer 14 during etching. The second hard mask layer 18 may be formed from a material that has etch selectivity in an etchant as compared to the etch stop layer 16 and the first hard mask layer 12. For example, in an embodiment, the second hard mask layer 18 may include an oxide such as silicon oxide, which has etch selectivity to oxide etchants such as, but not limited to, hydrofluoric acid. In the embodiment shown in the Figures, a third hard mask layer 20 is also provided for further protection of the first patternable layer 14 during etching, and the third hard mask layer 20 may include material having a different etch rate than the second hard mask layer 18, such as a nitride. It is to be appreciated that, although not shown, additional layers may be provided in the patternable structure 10. Further, although also not shown, the patternable structure may be disposed over a base substrate or other patterned structures.

Referring again to FIG. 1, Mandrels 22 are provided over the first hard mask layer 12. The mandrels 22 may be formed through conventional lithography/etching of a mandrel layer (not shown) that is formed over the first hard mask layer 12, and the mandrels 22 may include material that has etch selectivity in an etchant as compared to the first hard mask layer 12. For example, for the first hard mask layer 12 that includes amorphous silicon, the mandrels 22 may include a nitride such as silicon nitride.

Figure 2:
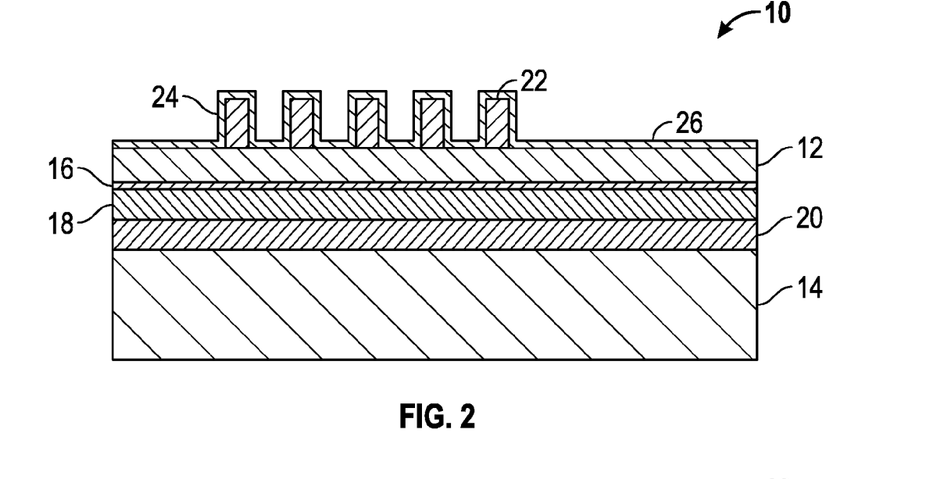
Figure 3:
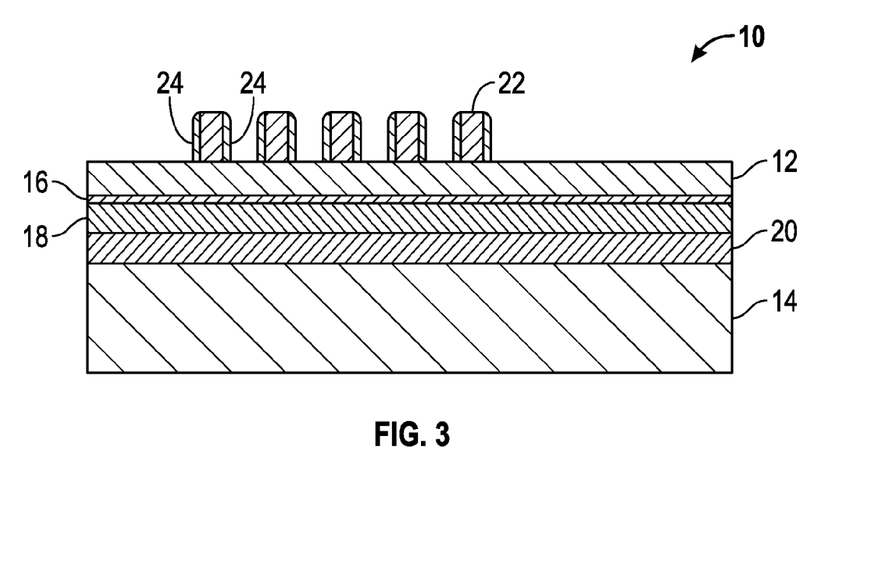

Referring to FIGS. 2 and 3, the mandrels 22 are provided as a template for later formation of sidewall spacers 24, with the sidewall spacers 24 formed adjacent sidewalls of the mandrels 22 and with the sidewall spacers 24 providing pitch doubling to achieve sub-resolution pitch that is not possible through patterning of the mandrels with conventional lithography/etching techniques. To form the sidewall spacers 24 and referring to FIG. 2, a spacer layer 26 is formed over the mandrels 22 and over the first hard mask layer 12, with portions of the spacer layer 26 that overly sidewalls of the mandrels 22 ultimately becoming the sidewall spacers 24. The term "overly" or "overlying", as referred to herein, means disposed on or over. The spacer layer 26 may be formed through conventional techniques, such as atomic layer deposition, and may have a thickness of from about 5 to about 50 nm. Suitable materials for the spacer layer 26 include materials that have etch selectivity in an etchant to both the mandrels 22 and the first hard mask layer 12. For example, in an embodiment, the first hard mask layer 12 includes amorphous silicon, the mandrels 22 include the nitride, and the spacer layer 26 is formed from an oxide such as silicon oxide. Referring to FIG. 3, the spacer layer may be anisotropically etched in an appropriate etchant to remove the spacer layer from horizontal surfaces, thereby leaving the sidewall spacers 24.

Figure 4:
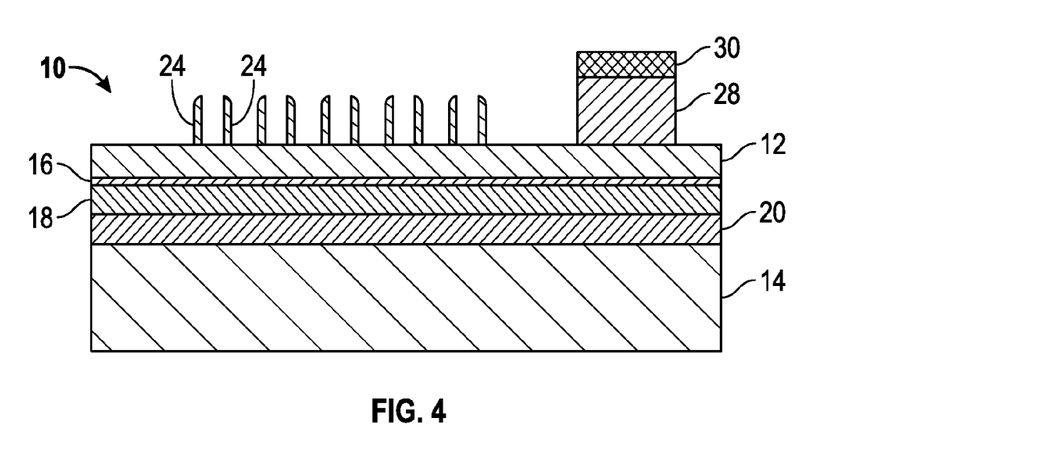

After forming the sidewall spacers 24 and as shown in FIG. 4, the mandrels may be removed, with the sidewall spacers 24 remaining over the first hard mask layer 12 after removing the mandrels and with the sidewall spacers 24 defining gaps therebetween. In the processes described herein, the sidewall spacers 24 mask the first hard mask layer 12 for pattern transfer into the first hard mask layer 12 through the gaps between the sidewall spacers 24. The sidewall spacers 24 generally have a nominal CD that remains unmodified, although it is to be appreciated that additional masking features may be formed over the first hard mask layer 12 prior to etching the first hard mask layer 12. For example, in an embodiment and as shown in FIG. 4, a patterned resist structure 28 may be formed over the first hard mask layer 12 through conventional lithography techniques, with an anti-reflectivelayer 30 disposed over the patterned resist structure 28 to provide lithography reflectivity control and also to serve as a hardmask during etching to form the patterned resist structure 28. The patterned resist structure 28, which generally has a larger CD than the sidewall spacers 24 due to the manner in which it is formed, may be appropriate when the first patternable layer 14 is a gate semiconductor layer, with gate semiconductor structures ultimately formed in the first patternable layer 14 and with the patterned resist structure 28 employed to pattern long channel gate structures at pitches that can be resolved by conventional lithography techniques into the first patternable layer 14. In this embodiment, the patterned resist structure 28 may also be referred to as a long channel mask 28, and the long channel mask 28 further masks the first hard mask layer 12 for pattern transfer into the first hard mask layer 12 through portions thereof that are not covered by the sidewall spacers 24 or the long channel mask 28.

Figure 5:
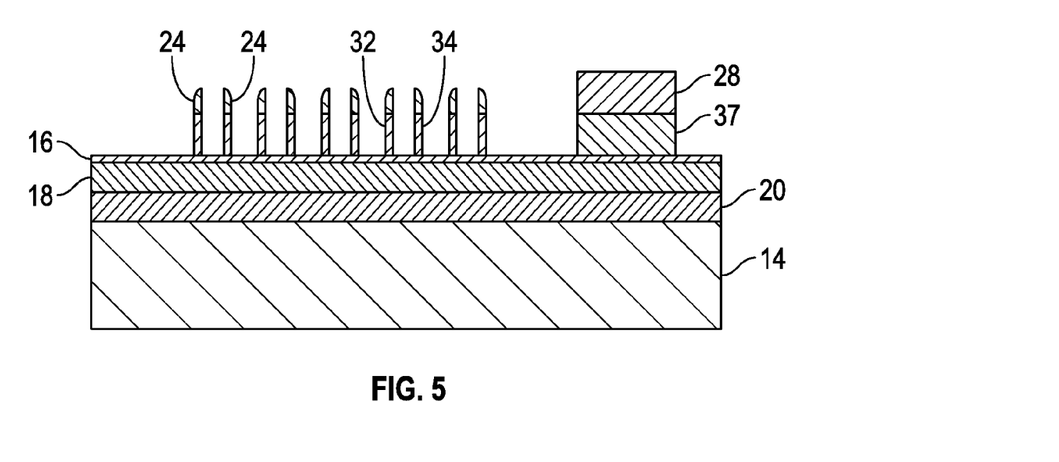

Referring to FIG. 5, the first hard mask layer is etched through the gaps between the sidewall spacers 24 to form a first patterned hard mask feature 32 and a second patterned hard mask feature 34. Conventional anisotropic etch techniques using an appropriate etchant for the material of the first hard mask layer 12 may be employed. For example, in an embodiment, the first hard mask layer 12 includes amorphous silicon and the anisotropic etching process may include a mixture of chlorine based and/or HBr based etchant. In the embodiment shown in FIG. 5, a long channel feature 37 is also formed beneath the long channel mask 28. The first patterned hard mask feature 32 and the second patterned hard mask feature 34 have the same nominal CD at the stage illustrated in FIG. 5, with the designations of the first patterned hard mask feature 32 and the second patterned hard mask feature 34 used to distinguish patterned hard mask features that are subject to CD modification or biasing (the first patterned hard mask feature 32) or that retain the nominal CD (the second patterned hard mask feature 34) that is produced by etching the first hard mask layer through the gaps between the sidewall spacers 24. It is to be appreciated that various patterned hard mask features may be characterized as first patterned hard mask features 32 or second patterned hard mask features 34, depending upon whether the patterned hard mask features retain the nominal CD or subject to CD modification. Further, it is to be appreciated that various patterned hard mask features may all have different CDs by selectively modifying the CDs of certain patterned hard mask features, and the instant invention is not to be read as limited to patterned hard mask features that only include nominal CDs or a single modified CD.

In the embodiment shown in FIG. 5, the first hard mask layer is etched through the gaps between the sidewall spacers 24, and further through the gap between the long channel mask 28 and an adjacent sidewall spacer, to the etch stop layer 16, with etching terminated at the etch stop layer 16 to form the first patterned hard mask feature 32 and the second patterned hard mask feature 34, as well as to form the long channel feature 37. The etch stop layer 16 protects the second hard mask layer 18 and the third hard mask layer 20 such that the hard mask layers 18, 20 remain intact during and after removal of the sidewall spacers 24. Further, the etch stop layer 16 provides protection to the hard mask layers 18, 20 during subsequent techniques for biasing CD to obtain the second hard mask features 34, as described in further detail below. The aforementioned functions of the etch stop layer 16 contribute to maximized CDU control between the patterned hard mask features 32, 34.

Figure 6:
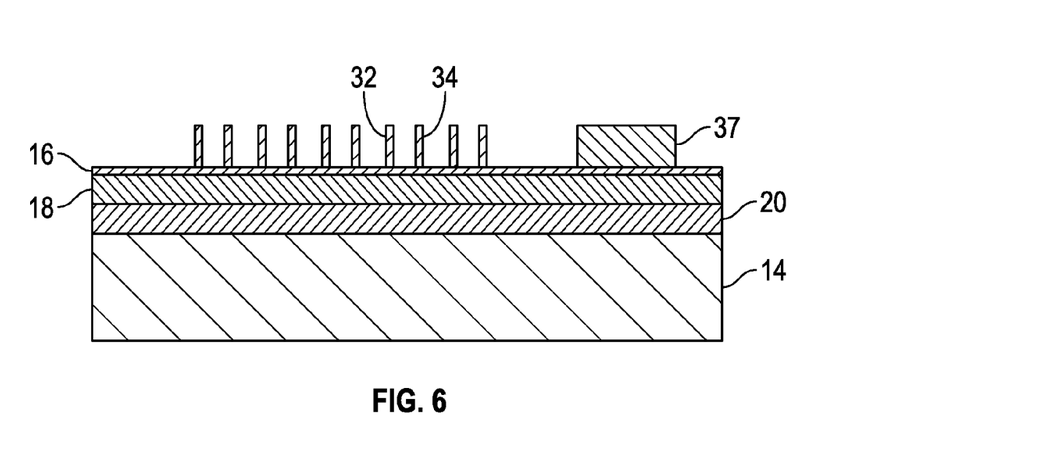

Referring to FIG. 6, the sidewall spacers may optionally be removed after etching the first hard mask layer through the gaps between the sidewall spacers, although it is to be appreciated that in other embodiments (not shown) the sidewall spacers may remain over the patterned hard mask features 32, 34. Additionally, as also shown in FIG. 6, the patterned resist structure 28 may also be removed after etching the first hard mask layer. Without being bound by any particular theory, removal of the sidewall spacers and the patterned resist structure 28 may promote enhanced symmetry during further etching through gaps between the patterned hard mask features 32, 34.

Figure 7A:
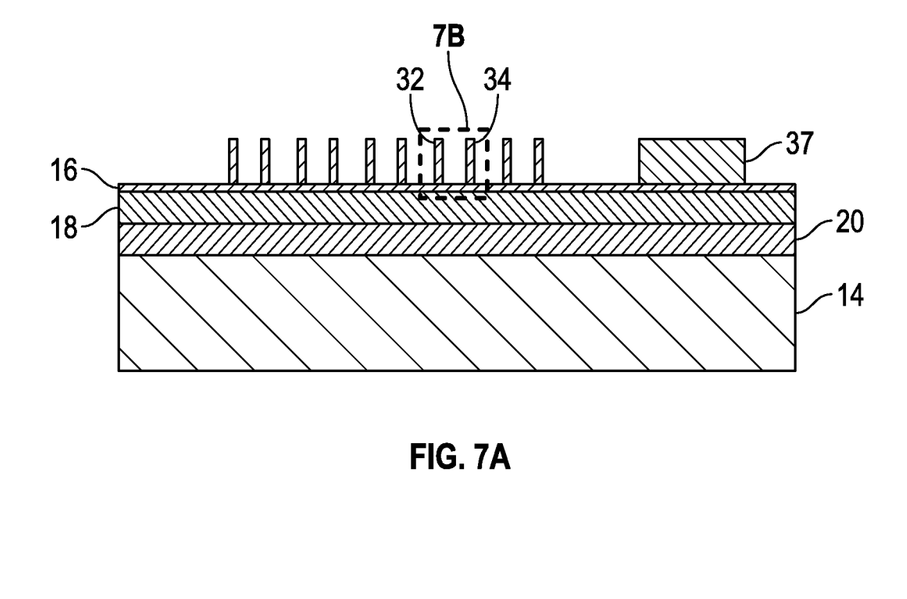
Figure 7B:
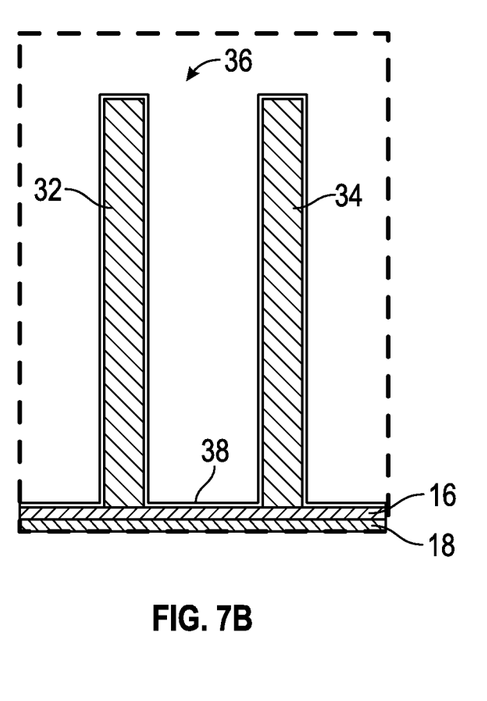
Figure 8A:
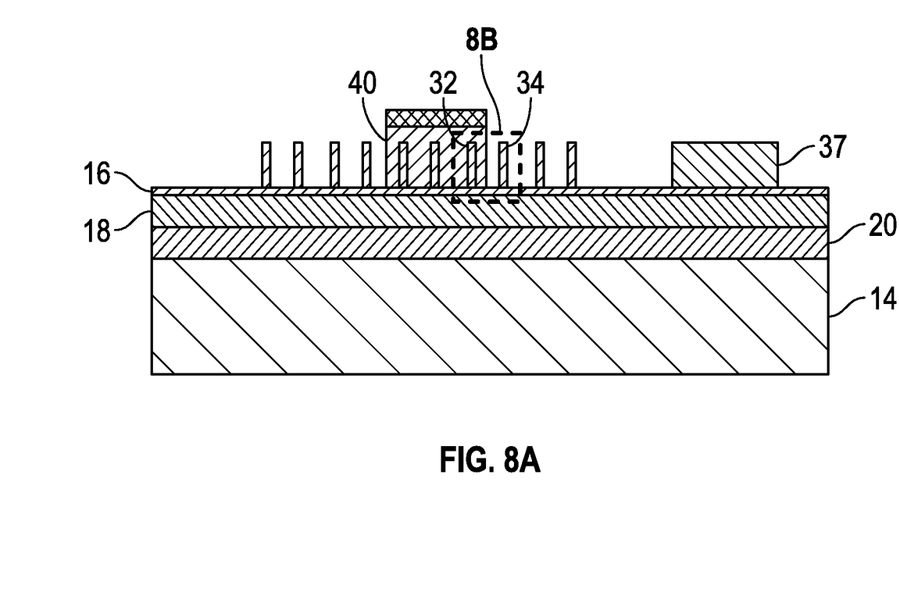
Figure 8B:
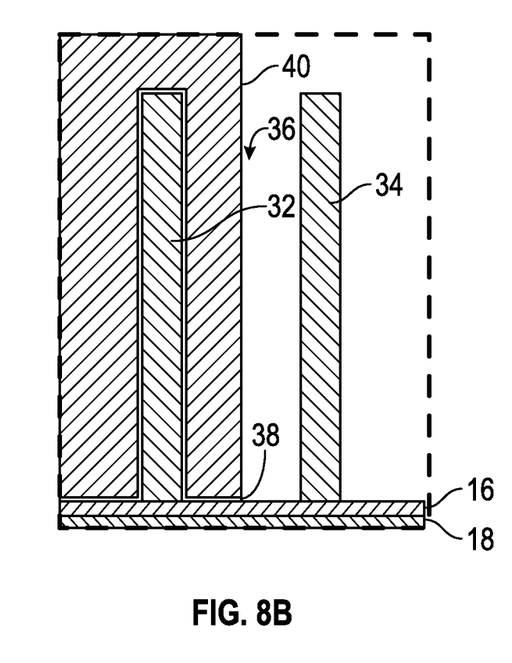
Figure 9A:
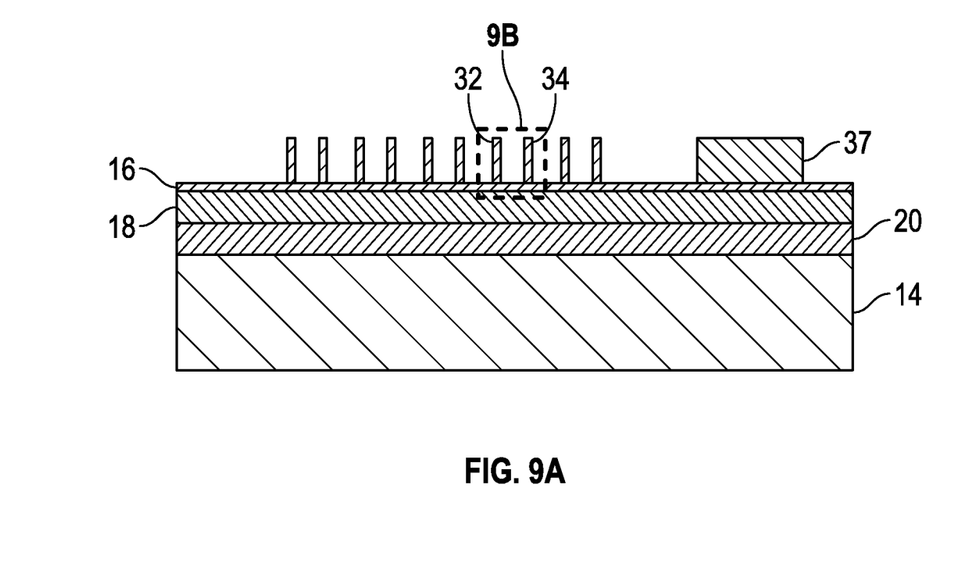
Figure 9B:
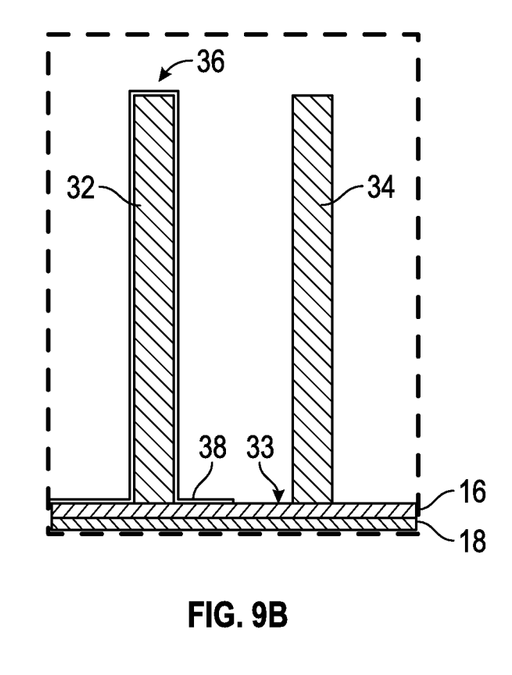

Referring to FIGS. 7-9, a CD of the first patterned hard mask feature 32 is modified relative to the second patterned hard mask feature 34 to form a biased hard mask feature 36. The biased hard mask feature 36 has a different CD than the second patterned hard mask feature 34, which retains the nominal CD that is produced after etching through the gap between the sidewall spacers. In embodiments, the CD of the first patterned hard mask feature 32 may be modified by increasing or decreasing the CD of the first patterned hard mask feature 32. In the embodiment shown in FIGS. 7-9, the CD of the first patterned hard mask feature 32 is modified by increasing the CD thereof to form the biased hard mask feature 36. In this embodiment and as shown in FIG. 9, an overlying layer 38 is ultimately formed over sidewalls of the first patterned hard mask feature 32, with sidewalls of the second patterned hard mask feature 34 being free of the overlying layer to provide a difference in CD between the first patterned hard mask feature 32 and the second patterned hard mask feature 34. Techniques for forming the overlying layer 38 over the first patterned hard mask feature 32 are not particularly limited, although deposition techniques capable of controllably depositing material for the overlying layer 38 on a nanometer scale are generally employed. For example, ALD may be employed to form the overlying layer 38. In an embodiment, the CD of the first patterned hard mask feature 32 is increased relative to the second patterned hard mask feature 34 in a range of from about 1 to about 10 nm, which is possible through ALD formation of the overlying layer 38. It is to be appreciated that larger changes in CD can also be realized, although industry trends seek to minimize changes in CD to thereby minimize device size. Further, the overlying layer 38 may include an overlying layer material with etch selectivity in an etchant as compared to the etch stop layer 16 and the first hard mask layer. For example, in an embodiment, the first hard mask layer includes amorphous silicon, the etch stop layer 16 includes the nitride, and the overlying layer 38 is formed from an oxide overlying material such as silicon oxide. The etch selectivity of the overlying layer 38 enables selective removal of the overlying layer 38 from the patterned hard mask features, as described in further detail below, for purposes of establishing different CDs of the patterned hard mask features in a controllable and manufacturable manner. By "manufacturable", it is meant that the different CDs of the patterned hard mask feature can be established in a way that can be reliably implemented on an industrial scale with highly consistent results.

A non-limiting example of one technique for modification of the CD of the first patterned hard mask feature 32 to form the biased hard mask feature 36 by increasing the CD thereof will now be described in further detail with reference to FIGS. 7-9. In this embodiment and referring to FIG. 7B, overlying layer material is deposited over the first patterned hard mask feature 32 and over the second patterned hard mask feature 34, thereby forming the overlying layer 38. In particular, the overlying layer 38 is initially formed over all exposed surfaces, such as through ALD, to establish a biased CD for all patterned hard mask features. Referring to FIGS. 8A and 8B, the first patterned hard mask feature 32 and the overlying layer 38 that is disposed on the first patterned hard mask feature 32 is masked with a first feature mask 40 after depositing the overlying layer material over the first patterned hard mask feature 32 and over the second patterned hard mask feature 34, and the second patterned hard mask feature 34 remains unmasked. The overlying layer is then etched from over the second patterned hard mask feature 34 after masking the first patterned hard mask feature 32 to thereby remove the overlying layer from unmasked surfaces, including the second patterned hard mask feature 34. In this manner, the CD of the second patterned hard mask feature 34 is returned to the nominal CD. The first patterned hard mask feature 32 retains the overlying layer 38, which effectively modifies the CD of the first patterned hard mask feature 32 to form the biased hard mask feature 36 and provides a biased CD relative to the second patterned hard mask feature 34. As shown in FIGS. 9A and 9B, the first feature mask 40 may be removed after etching the overlying layer 38 from over the second patterned hard mask feature 34. Because the overlying layer 38 has etch selectivity relative to the patterned hard mask features 32, 34, the overlying layer 38 may be effectively removed in a controlled and manufacturable manner, with etching terminated or significantly reduced once the overlying layer 38 is removed from unmasked surfaces. Also, because the overlying layer 38 may have relatively small thicknesses of from about 0.5 to about 5 nm, differences in CD between the patterned hard mask features 32, 34 on that scale can also be reliability achieved. The stages shown in FIGS. 7-9 may be repeated as desired depending upon a number of different CDs to be established for the patterned hard mask features. Further and although not shown, additional overlying layers can be deposited over existing overlying layers. For example, if nominal, +2 nm, and +4 nm CDs are desired, this can be achieved by depositing two overlying layers having a thickness of 2 nm in a stacked configuration (thereby accumulating two layers of the overlying layer instead of forming a 4 nm thick overlying layer).

Figure 10A:
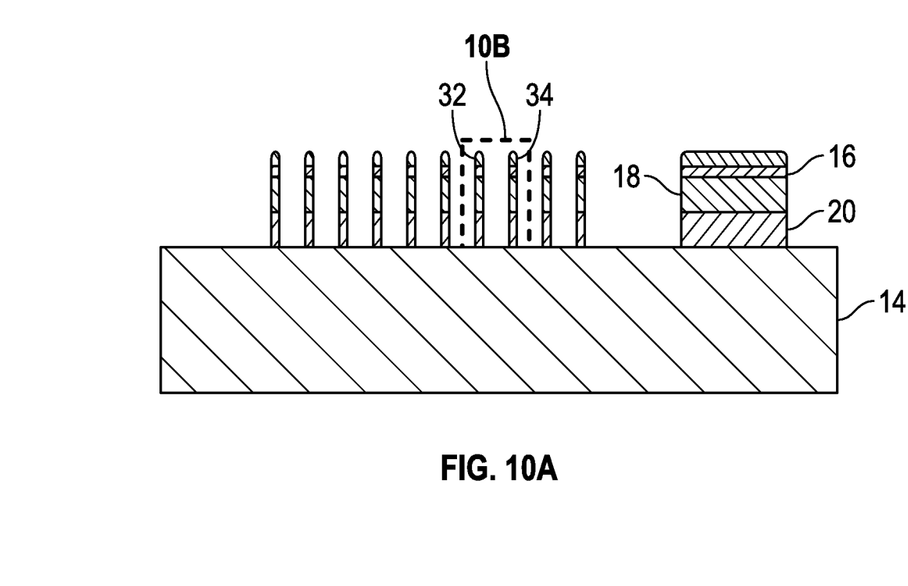
Figure 10B:
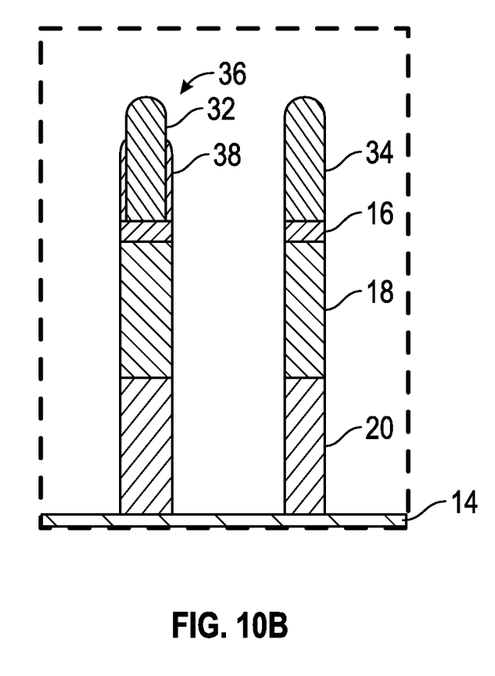

After modifying the CD of the first patterned hard mask feature 32, material is exposed in a space 33 that is defined between the biased hard mask feature 36 and the second patterned hard mask feature 34. In particular, in an embodiment and as shown in FIG. 9B, the space 33 is defined between the overlying layer 38 over the sidewall of the first patterned hard mask feature 32 and the second patterned hard mask feature 34. The exposed material can be the material any layer that is disposed between the biased hard mask feature 36 and the second patterned hard mask feature 34. In an embodiment and as shown in FIG. 9B, the exposed material includes the etch stop layer 16 as well as the overlying layer 38 that is unmasked after CD modification. However, it is to be appreciated that in other embodiments and although not shown, the etch stop layer may be absent and the exposed material may be material of any layer that is exposed between the biased hard mask feature 36 and the second patterned hard mask feature 34. Referring to FIGS. 10A and 10B, in an embodiment and as set forth above, the second hard mask layer 18 and the third hard mask layer 20 may be disposed between the etch stop layer 16 and the first patternable layer 14. In this embodiment, the second hard mask layer 18 has etch selectivity in an etchant as compared to the first hard mask layer, and the third hard mask layer 20 has etch selectivity in an etchant as compared to the second hard mask layer 18. The second hard mask layer 18 and the third hard mask layer 20 are selectively etched through the space 33 between the sidewalls of the biased hard mask feature 36 and the second patterned hard mask feature 34, and the etch rate of the second hard mask layer 18 and the third hard mask layer 20 may be higher than an etch rate of the biased hard mask feature 36 and the second patterned hard mask feature 34. In particular, the etch rates of the second hard mask layer 18 and the third hard mask layer 20 are higher in an etchant than etch rates of the first patterned hard mask features 32, the overlying layer 38 over the first patterned hard mask features 32, and the second patterned hard mask features 34 such that the biased hard mask feature 36 and the second patterned hard mask feature 34 remain intact with their respective CDs during pattern transfer into the second hard mask layer 18 and the third hard mask layer 20. It is to be appreciated that the second hard mask layer 18 and the third hard mask layer 20 are optional and that in other embodiments, etching may proceed through the space 33 between the overlying layer 38 over the sidewall of the first patterned hard mask feature 32 and the second patterned hard mask feature 34 directly through the first patternable layer 14.

Figure 11A:
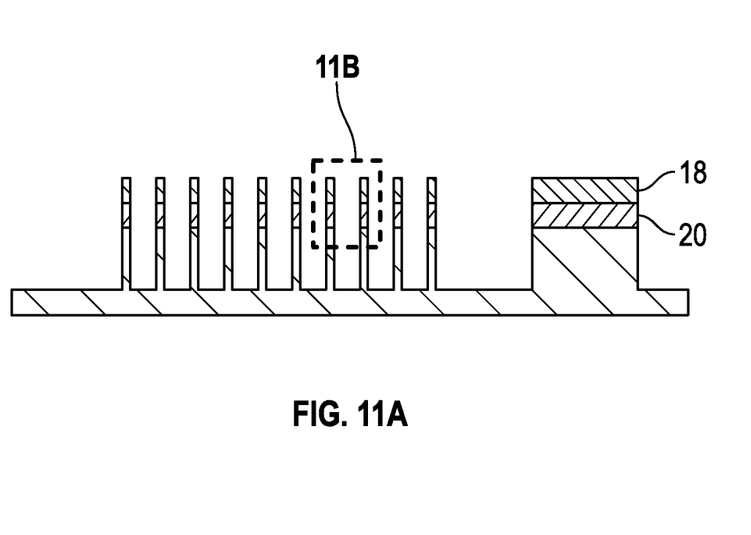
Figure 11B:
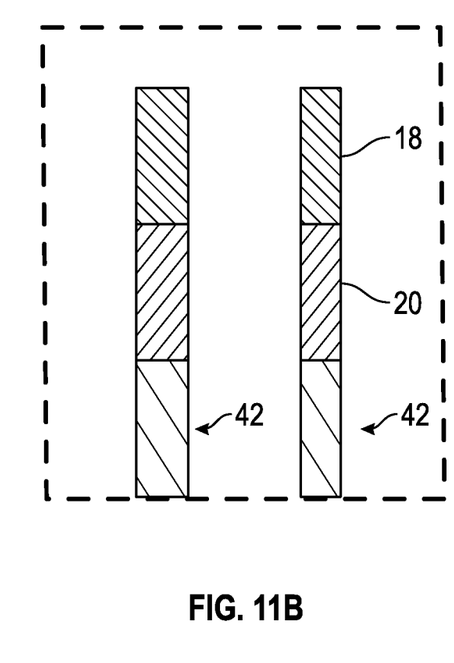

Referring to FIGS. 11A and 11B, the first patternable layer is etched through the space between the sidewalls of the biased hard mask feature and the second patterned hard mask feature, thereby transferring the multiple CD configuration into the first patternable layer to form patterned device features 42. As shown in FIGS. 11A and 11B, the biased hard mask feature and the second patterned hard mask layer may be removed, thereby leaving the second hard mask layer 18 and, optionally, the third hard mask layer 20 after pattern transfer thereinto. In other embodiments and although not shown, it is to be appreciated that the biased hard mask feature and the second patterned hard mask layer may remain in place during etching of the first patternable layer 14. In this manner, the patterned device features 42 are formed in the first patterned layer having the multi CD configuration.

As alluded to above, the multiple CD SADP processes described herein may be employed at various stages during integrated circuit fabrication including, but not limited to, gate level patterning and patterning of fins during fin field effect transistor (FET) fabrication, as well as other patterning stages during front-end-of-line (FEOL) or back-end-of-line (BEOL) processing. For example, in various embodiments, the first patternable layer may be a gate semiconductor layer, and the gate semiconductor layer may be etched to form the patterned device features 42 as gate semiconductor structures. In other embodiments, the first patternable layer may be a semiconductor substrate, and the semiconductor substrate may be etched to form fins in the semiconductor substrate for later use in FinFET devices. In other embodiments, the first patternable layer may be an interlayer dielectric layer, and the interlayer dielectric layer may be etched to form a trench therein for subsequent formation of circuitry routing therein.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit comprising:
   providing a patternable structure comprising a first hard mask layer and a first patternable layer underlying the first hard mask layer;
   providing mandrels over the first hard mask layer;
   forming sidewall spacers adjacent sidewalls of the mandrels;
   removing the mandrels, with the sidewall spacers remaining and defining gaps therebetween;
   etching the first hard mask layer through the gaps between the sidewall spacers to form a first patterned hard mask feature and a second patterned hard mask feature;
   selectively modifying a critical dimension thickness of the first patterned hard mask feature relative to the second patterned hard mask feature to form a biased hard mask feature, wherein a space is defined between sidewalls of the biased hard mask feature and the second patterned hard mask feature; and
   etching the first patternable layer through exposed material in the space defined between sidewalls of the biased hard mask feature and the second patterned hard mask feature.

2. The method of claim 1, wherein selectively modifying the critical dimension thickness comprises increasing the critical dimension thickness of the first patterned hard mask feature to form the biased hard mask feature.

3. The method of claim 2, wherein increasing the critical dimension thickness of the first patterned hard mask feature comprises increasing the critical dimension thickness of the first patterned hard mask feature relative to the second patterned hard mask feature in a range of from about 1 to about 10 nm.

4. The method of claim 2, wherein selectively modifying the critical dimension thickness comprises forming an overlying layer over sidewalls of the first patterned hard mask feature to form the biased hard mask feature, wherein sidewalls of the second patterned hard mask feature are free of the overlying layer, and wherein the space is defined between the overlying layer over the sidewall of the first patterned hard mask feature and the second patterned hard mask feature.

5. The method of claim 4, wherein forming the overlying layer comprises forming the overlying layer comprising an oxide overlying layer material over sidewalls of the first patterned hard mask feature.

6. The method of claim 4, wherein forming the overlying layer over the sidewalls of the first patterned hard mask feature comprises depositing overlying layer material over the first patterned hard mask feature and over the second patterned hard mask feature.

7. The method of claim 6, further comprising masking the first patterned hard mask feature after depositing the overlying layer material over the first patterned hard mask feature and over the second patterned hard mask feature, wherein the second patterned hard mask feature remains unmasked.

8. The method of claim 7, further comprising etching the overlying layer material from over the second patterned hard mask feature after masking the first patterned hard mask feature.

9. The method of claim 1, wherein the patternable structure further comprises an etch stop layer disposed between the first hard mask layer and the first patternable layer, and wherein etching the first hard mask layer comprises etching to the etch stop layer with etching terminated at the etch stop layer.

10. The method of claim 9, wherein the patternable structure further comprises a second hard mask layer disposed between the etch stop layer and the first patternable layer, and wherein the method further comprises etching the second hard mask layer through the exposed surface between the sidewalls of the biased hard mask feature and the second patterned hard mask feature prior to etching the first patternable layer through the exposed surface between the sidewalls of the biased hard mask feature and the second patterned hard mask feature.

11. The method of claim 10, further comprising removing the first patterned hard mask feature and the second patterned hard mask feature prior to etching the first patternable layer through the exposed surface between the sidewalls of the biased hard mask feature and the second patterned hard mask feature.

12. The method of claim 1, wherein the first patternable layer is a gate semiconductor layer, and wherein etching the first patternable layer comprises etching the gate semiconductor layer to form gate semiconductor structures.

13. The method of claim 12, further comprises forming a long channel mask over the first hard mask layer prior to etching the first hard mask layer through the exposed surface between the sidewall spacers.

14. The method of claim 1, wherein the first patternable layer is a semiconductor substrate, and wherein etching the first patternable layer comprises etching the semiconductor substrate to form fins in the semiconductor substrate.

15. The method of claim 1, wherein the first patternable layer is an interlayer dielectric layer, and wherein etching the first patternable layer comprises etching the interlayer dielectric layer to form a trench therein.

16. The method of claim 1, wherein providing the patternable structure comprises providing the patternable structure comprising the first hard mask layer comprising amorphous semiconductor material.

17. A method of forming an integrated circuit comprising:
    providing a patternable structure comprising a first hard mask layer, a first patternable layer underlying the first hard mask layer, an etch stop layer disposed between the first hard mask layer and the first patternable layer, and a second hard mask layer disposed between the etch stop layer and the first patternable layer wherein the second hard mask layer has etch selectivity in an etchant as compared to the first hard mask layer;
    providing mandrels over the first hard mask layer;
    forming sidewall spacers adjacent sidewalls of the mandrels;
    removing the mandrels, with the sidewall spacers remaining and defining gaps therebetween;
    etching the first hard mask layer through the gaps between the sidewall spacers to the etch stop layer with etching terminated at the etch stop layer to form a first patterned hard mask feature and a second patterned hard mask feature;
    selectively modifying a critical dimension of the first patterned hard mask feature relative to the second patterned hard mask feature to form a biased hard mask feature, wherein a space is defined between sidewalls of the biased hard mask feature and the second patterned hard mask feature; and
    selectively etching the second hard mask layer through the exposed surface between the sidewalls of the biased hard mask feature and the second patterned hard mask feature at a higher rate than etching of the biased hard mask feature and the second patterned hard mask feature;
    etching the first patternable layer through exposed material in the space defined between sidewalls of the biased hard mask feature and the second patterned hard mask feature after etching the second hardmask layer through the exposed surface between the sidewalls of the biased hard mask feature and the second patterned hard mask feature.

18. A multiple critical dimension self-aligned double patterning process comprising:
    providing a patternable structure comprising a first hard mask layer, a first patternable layer underlying the first hard mask layer, and an etch stop layer disposed between the first hard mask layer and the first patternable layer;
    providing mandrels over the first hard mask layer;
    forming sidewall spacers adjacent sidewalls of the mandrels;
    removing the mandrels, with the sidewall spacers remaining and defining gaps therebetween;
    etching the first hard mask layer through the gaps between the sidewall spacers to the etch stop layer with etching terminated at the etch stop layer to form a first patterned hard mask feature and a second patterned hard mask feature;
    selectively modifying a critical dimension thickness of the first patterned hard mask feature relative to the second patterned hard mask feature to form a biased hard mask feature, wherein a space is defined between sidewalls of the biased hard mask feature and the second patterned hard mask feature; and
    etching the first patternable layer through exposed material in the space defined between the sidewalls of the biased hard mask feature and the second patterned hard mask feature.

19. The process of claim 18, wherein selectively modifying the critical dimension thickness comprises forming an overlying layer over sidewalls of the first patterned hard mask feature, wherein sidewalls of the second patterned hard mask feature are free of the overlying layer, and wherein the space is defined between the overlying layer over the sidewall of the first patterned hard mask feature and the second patterned hard mask feature.

* * * * *